(12) United States Patent
Nishihata et al.

(10) Patent No.: US 8,405,194 B2
(45) Date of Patent: Mar. 26, 2013

(54) SEMICONDUCTOR DEVICE INCLUDING TWO HEAT SINKS AND METHOD OF MANUFACTURING THE SAME

(75) Inventors: Masayoshi Nishihata, Chiryu (JP); Yasushi Ookura, Okazaki (JP)

(73) Assignee: Denso Corporation, Kariya (JP)

( * ) Notice: Subject to any disclaimer, the term of this patent is extended or adjusted under 35 U.S.C. 154(b) by 157 days.

(21) Appl. No.: 12/801,862

(22) Filed: Jun. 29, 2010

(65) Prior Publication Data
US 2010/0327455 A1 Dec. 30, 2010

(30) Foreign Application Priority Data

Jun. 30, 2009 (JP) ................................. 2009-155051
Feb. 3, 2010 (JP) ................................... 2010-22340

(51) Int. Cl.
*H01L 23/367* (2006.01)
(52) U.S. Cl. ........ 257/675; 257/690; 257/773; 257/796; 257/E23.043; 257/E23.051; 257/E23.101; 438/122; 438/123; 438/124; 438/127
(58) Field of Classification Search .................. 257/675, 257/678, 687, 712, 796, E23.08, E23.101, 257/E23.102, E23.104, E23.123–E23.129, 257/676, 690, 692, 706, 708, 710, 734, 773, 257/E23.043, E23.051, E23.151, 790; 438/106, 438/127, 119, 121–124
See application file for complete search history.

(56) References Cited

U.S. PATENT DOCUMENTS

| | | | | |
|---|---|---|---|---|
| 4,026,008 A | * | 5/1977 | Drees et al. ...................... 29/593 |
| 5,539,250 A | * | 7/1996 | Kitano et al. ................. 257/666 |
| 5,594,282 A | * | 1/1997 | Otsuki .......................... 257/796 |
| 5,807,768 A | * | 9/1998 | Shin ............................... 438/127 |
| 5,970,320 A | * | 10/1999 | Yamasaki et al. ............. 438/123 |
| 6,133,623 A | * | 10/2000 | Otsuki et al. .................. 257/666 |
| 6,597,063 B1 | * | 7/2003 | Shimizu et al. ............... 257/687 |
| 6,706,565 B2 | * | 3/2004 | Brand ........................... 438/126 |
| 7,391,101 B2 | * | 6/2008 | Takahata et al. .............. 257/672 |

(Continued)

FOREIGN PATENT DOCUMENTS

| JP | A-2001-015557 | | 1/2001 |
| JP | 2002-33430 | * | 1/2002 |

(Continued)

OTHER PUBLICATIONS

Office Action mailed Oct. 4, 2011 in corresponding JP application No. 2010-022340 (and English translation).

*Primary Examiner* — Fernando L Toledo
*Assistant Examiner* — Victoria K Hall
(74) *Attorney, Agent, or Firm* — Posz Law Group, PLC

(57) ABSTRACT

A semiconductor device includes a semiconductor element, a first heat sink, a second heat sink, and a resin member. The semiconductor element has first and second surfaces. The first heat sink has a first heat radiation surface and a first end surface. The first end surface is coupled with the first surface. The second heat sink has a second heat radiation surface, the second end surface being opposite the second heat radiation surface, and a depressed section depressed toward the second heat radiation surface. The second surface of the semiconductor element is coupled with a bottom surface of the depressed section. The resin member is disposed in the depressed section and seals the semiconductor element, the first heat sink, and the second heat sink in such a manner that the first heat radiation surface is exposed outside the resin member.

29 Claims, 11 Drawing Sheets

U.S. PATENT DOCUMENTS

| | | | |
|---|---|---|---|
| 7,518,219 B2 * | 4/2009 | Bish et al. | 257/669 |
| 7,759,163 B2 * | 7/2010 | Kroeninger et al. | 438/113 |
| 2003/0122232 A1 * | 7/2003 | Hirano et al. | 257/678 |
| 2004/0080028 A1 * | 4/2004 | Yanagisawa | 257/675 |
| 2004/0089941 A1 * | 5/2004 | Mamitsu et al. | 257/718 |
| 2004/0232545 A1 * | 11/2004 | Takaishi | 257/707 |
| 2005/0167802 A1 * | 8/2005 | Hirano et al. | 257/678 |
| 2006/0091512 A1 * | 5/2006 | Shinohara | 257/678 |
| 2006/0145335 A1 | 7/2006 | Teshima et al. | |
| 2007/0090463 A1 * | 4/2007 | Xiaochun | 257/369 |
| 2008/0001277 A1 * | 1/2008 | Wen et al. | 257/687 |
| 2009/0001614 A1 * | 1/2009 | Condie et al. | 257/795 |

FOREIGN PATENT DOCUMENTS

| | | |
|---|---|---|
| JP | A-2002-329804 | 11/2002 |
| JP | A-2008-218616 | 9/2008 |
| JP | A-2009-188376 | 8/2009 |

* cited by examiner

SEMICONDUCTOR DEVICE INCLUDING TWO HEAT SINKS AND METHOD OF MANUFACTURING THE SAME

CROSS REFERENCE TO RELATED APPLICATIONS

The present application is based on and claims priority to Japanese Patent Applications No. 2009-155051 filed on Jun. 30, 2009, and No. 2010-22340 filed on Feb. 3, 2010, the contents of which are incorporated in their entirety herein by reference.

BACKGROUND OF THE INVENTION

1. Field of the Invention

The present invention relates to a semiconductor device including two heat sinks. The present invention also relates to a method of manufacturing a semiconductor device including two heat sinks.

2. Description of the Related Art

A semiconductor device having a pair of heat sinks is disclosed, for example, in US 2006/0145335 A1 (corresponding to JP 2007-27794). In a semiconductor device disclosed in US 2006/0145335 A1, a heater element is resin member. A heat radiation surface of the first heat sink and a heat radiation surface of the second heat sink are exposed outside the resin member.

In a method of manufacturing the semiconductor device, a stacked body in which the heater element is disposed between the first heat sink and the second heat sink is set in a molding die and the resin member is formed by transfer molding. When the resin member is formed, at least one of the heat radiation surfaces of the first heat sink and the second heat sink is buried in the resin member.

Then, the heat radiation surface buried in the resin member is grinded or cut with the resin member from an outside of the resin member so that the heat radiation surface is exposed outside the resin member. By the above-described method, inclination of the heat radiation surfaces can be controlled. Thus, a degree of parallelism between the heat radiation surface of the first heat sink and the heat radiation surface of the second heat sink can be set to a predetermined value.

In the above-described method, at least one of the heat radiation surfaces is buried in the resin member when the resin member is formed by transfer molding using the molding die. Therefore, it is necessary to grind or cut the heat radiation surface with the resin member so that the heat radiation surface is exposed outside the resin member.

SUMMARY OF THE INVENTION

In view of the foregoing problems, it is an object of the present invention to provide a semiconductor device including two heat sinks. Another object of the present invention is to provide a method of manufacturing a semiconductor device including two heat sinks.

A semiconductor device according to an aspect of the present invention includes a semiconductor element, a first heat sink, a second heat sink, and a resin member. The semiconductor element has a first surface and a second surface. The second surface is opposite the first surface in one direction. The first heat sink has a first heat radiation surface and a first end surface. The first end surface is opposite the first heat radiation surface in the one direction. The first end surface is thermally and electrically coupled with the first surface of the semiconductor element. The second heat sink has a second heat radiation surface, the second end surface, and a depressed section. The second end surface is opposite the second heat radiation surface in the one direction. The second end surface surrounds the depressed section. The depressed section is depressed toward the second heat radiation surface and has a bottom surface. The bottom surface is thermally and electrically coupled with the second surface of the semiconductor element. The resin member is disposed in the depressed section and seals the semiconductor element, the first heat sink, and the second heat sink in such a manner that the first heat radiation surface is exposed outside the resin member.

The second heat sink can be used as a container for housing the resin member, and the resin member can be disposed in the depressed section of the second heat sink. Thus, the second heat radiation surface being opposite the bottom surface of the depressed section is not buried in the resin member. Therefore, it is not necessary to cut or grind the resin member and the heat radiation surfaces for exposing the heat radiation surfaces outside the resin member.

A method of manufacturing a semiconductor device according to another aspect of the present invention includes forming a semiconductor element, forming a first heat sink, forming a second heat sink, coupling the semiconductor element with the first heat sink and the second heat sink, and forming a resin member. The semiconductor element has a first surface and a second surface, and the second surface is opposite the first surface. The first heat sink has a first heat radiation surface and a first end surface, and the first end surface is opposite the first heat radiation surface. The second heat sink has a second heat radiation surface, a second end surface, and a depressed section. The second end surface is opposite the second heat radiation surface. The second end surface surrounds the depressed section. The depressed section is depressed toward the second heat radiation surface and has a bottom surface. The first surface of the semiconductor element is thermally and electrically coupled with the first end surface of the first heat sink. The second surface of the semiconductor element is thermally and electrically coupled with the bottom surface of the depressed section. The resin member is formed in the depressed section, and the semiconductor element, the first heat sink, and the second heat sink are sealed with the resin member.

In the above-described method, the second heat sink can be used as a molding die for forming the resin member. Thus, the second heat radiation surface being opposite the bottom surface of the depressed section is not buried in the resin member. Therefore, it is not necessary to cut or grind the resin member and the heat radiation surfaces for exposing the heat radiation surfaces outside the resin member.

BRIEF DESCRIPTION OF THE DRAWINGS

Additional objects and advantages of the present invention will be more readily apparent from the following detailed description of exemplary embodiments when taken together with the accompanying drawings. In the drawings.

Figure 1:
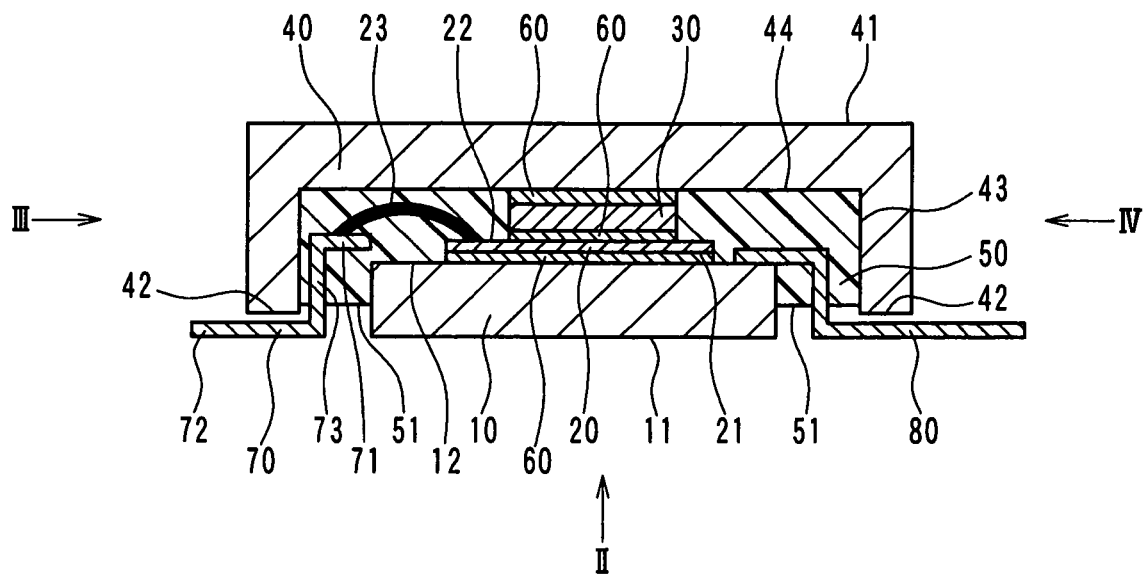
FIG. 1 is a cross-sectional view of a semiconductor device according to a first embodiment of the present invention.
Figure 2:
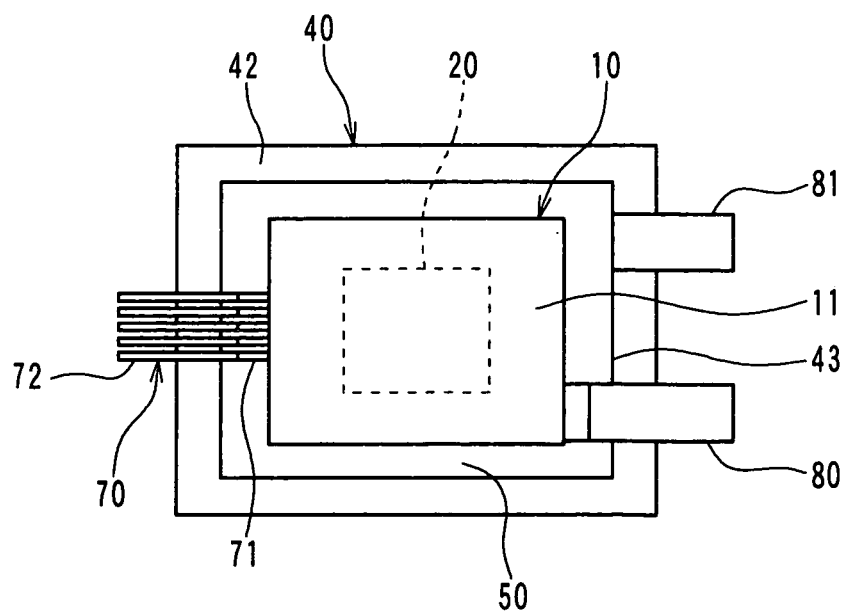
FIG. 2 is a diagram of the semiconductor device viewed from a direction shown by the arrow II in FIG. 1.

DETAILED DESCRIPTION OF THE EXEMPLARY EMBODIMENTS (First Embodiment)

A semiconductor device according to a first embodiment of the present invention will be described with reference to FIG. 1 to FIG. 4. The semiconductor device according to the present embodiment can be suitably used for an inverter control of a hybrid vehicle, for example.

The semiconductor device includes a first heat sink 10, a semiconductor element 20, a block body 30, a second heat sink 40, and a first resin member 50.

The first heat sink 10, the semiconductor element 20, and the block body 30 are stacked in one direction. Between the first heat sink 10 and the semiconductor element 20, between the semiconductor element 20 and the block body 30, and between the block body 30 and the second heat sink 40, a solder 60 is disposed. Thus, the first heat sink 10 and the semiconductor element 20 are coupled through the solder 60, the semiconductor element 20 and the block body 30 are coupled through the solder 60, and the block body 30 and the second heat sink 40 are coupled through the solder 60.

The first heat sink 10, the block body 30, and the second heat sink 40 radiate heat generated at the semiconductor element 20 to an outside of the semiconductor device. The first heat sink 10, the block body 30, and the second heat sink 40 are formed, for example, by press working or cutting.

Each of the first heat sink 10 and the second heat sink 40 can function as a heat sink for radiating heat generated in the semiconductor device to the outside of the semiconductor device. Each of the first heat sink 10 and the second heat sink 40 can also function as an electrode for electrically coupling the semiconductor device and an external device. Each of the first heat sink 10 and the second heat sink 40 is made of a material having a high electric conductivity and a high thermal conductivity. For example, each of the first heat sink 10 and the second heat sink 40 is made of copper, gold, or an alloy of copper and gold.

The first heat sink 10 has a first heat radiation surface 11 and a first end surface 12. The first end surface 12 is opposite the first heat radiation surface 11 in the one direction. The first end surface 12 is thermally and electrically coupled with the semiconductor element 20. The second heat sink 40 has a second heat radiation surface 41, a second end surface 42, and a depressed section 43. The second end surface 42 is opposite the second heat radiation surface 41 in the one direction. The second end surface 42 surrounds the depressed section 43. The depressed section 43 is depressed toward the second heat radiation surface 41 and has a bottom surface 44. That is, the second heat sink 40 has a shape of container having a bottom. The bottom surface 44 is thermally and electrically coupled with the semiconductor element 20.

The semiconductor element 20 is a semiconductor chip in which, for example, an insulated gate bipolar transistor (IGBT), a metal-oxide semiconductor (MOS) transistor, and a diode are formed. The semiconductor element 20 has a first surface 21 and a second surface 22. The second surface 22 is opposite the first surface 21 in the one direction. On the first surface 21 and the second surface 22, electrodes to be soldered are disposed. The first surface 21 is thermally and electrically coupled with the first end surface 12 of the first heat sink through the solder 60. The second surface 22 is thermally and electrically coupled with the block body 30 through the solder 60.

The block body 30 is a heat sink made of metal. The block body 30 transmits the heat generated at the semiconductor element 20 to the second heat sink 40. The block body 30 is thermally and electrically coupled with the bottom surface 44 of the depressed section 43 of the second heat sink 40 through the solder 60.

As shown in FIG. 1, the first heat sink 10, the semiconductor element 20, and the block body 30 are stacked through the solder 60 and configure a stacked body. The stacked body is housed in the depressed section 43 of the second heat sink 40. Thus, the first heat sink 10 is located in the depressed section 43 and is surrounded by the second heat sink 40.

Figure 3:
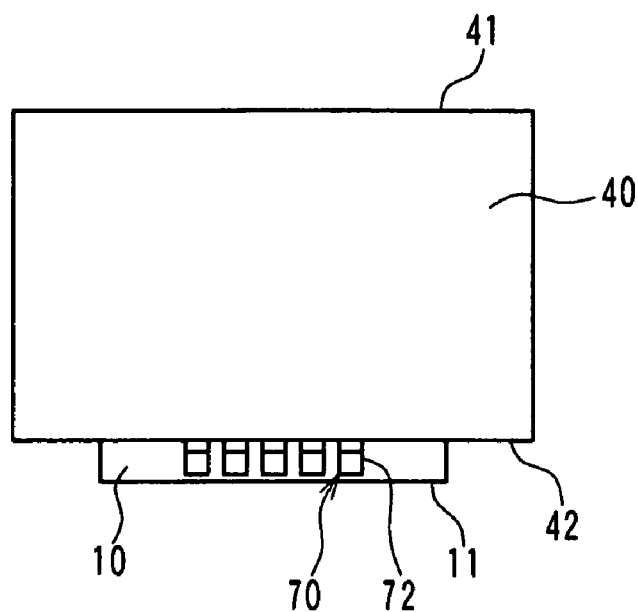
FIG. 3 is a diagram of the semiconductor device viewed from a direction shown by the arrow III in FIG. 1.
Figure 4:
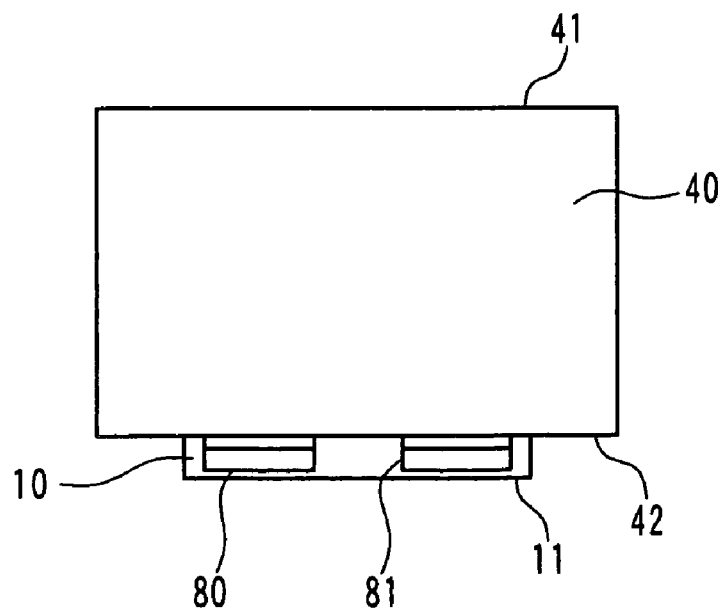
FIG. 4 is a diagram of the semiconductor device viewed, from a direction shown by the arrow IV in FIG. 1.

The second end surface 42 of the second heat sink 40 is located between the first heat radiation surface 11 and the first end surface 12 in the one direction. Thus, as shown in FIG. 3 and FIG. 4, a part of the first heat sink 10 protrudes from the second heat sink 40.

The semiconductor device further includes a plurality of signal terminals 70, a first lead 80, and a second lead 81 for electrically coupling the semiconductor element 20, the first heat sink 10, and the second heat sink 40 with an external device.

Each of the signal terminals 70 electrically couples the semiconductor element 20 with an external device. Each of the signal terminals 70 includes a first end portion 71, a second end portion 72, and a stepped portion 73. The first end portion 71 is electrically coupled with the semiconductor element 20. The second end portion 72 is electrically coupled with the external device. The stepped portion 73 is a bent portion provided between the first end portion 71 and the second end portion 72.

The first end portion 71 is located in the depressed section 43 of the second heat sink 40 and is coupled with the semiconductor element 20 through a wire 23. Because the stepped portion 73 is provided between the first end portion 71 and the second end portion 72, the second end portion 72 is located between the first end portion 12 and the first heat radiation surface 11 in the one direction. As shown in FIG. 1, the second end portion 72 is located between the second end surface 42 and the first heat radiation surface 11 in the one direction.

The first lead 80 electrically couples the first heat sink 10 and an external device. The first lead 80 has a first end portion, a stepped portion, and a second end portion in a manner similar to the signal terminals 70. The first end portion of the first lead 80 is joined on the first end surface 12 of the first heat sink 10. As shown in FIG. 4, the second end portion of the first lead 80 is located between the second end surface 42 and the first heat radiation surface 11 in the one direction.

The second lead 81 electrically couples the second heat sink 40 and an external device. As shown in FIG. 4, the second lead 81 is disposed next to the first lead 80 and is joined on the second end surface 42 of the second heat sink 40.

The first resin member 50 seals the semiconductor element 20, the block body 30, the first heat sink 10, and the second heat sink 40. The first resin member 50 is disposed in the depressed section 43 in such a manner that the first heat radiation surface 11 is exposed outside the first resin member 50. That is, the depressed section 43 of the second heat sink 40 can function as a container for housing the first resin member 50.

The first resin member 50 also seals the first end portion 71 and a part of the stepped portion 73 of each of the signal terminals 70 and the first end portion and a part of the stepped portion of the first lead 80. Because each of the signal terminals 70 and the first lead 80 has the stepped portion, the first end portion 71 of each of the signal terminals 70 and the first end portion of the first lead 80 can be buried in the first resin member 50 in the depressed section 43 while the second end portion 72 of each of the signal terminals 70 and the second end potion of the first lead 80 can be located outside the depressed section 43.

As shown in FIG. 1, a top surface 51 of the first resin member 50 is located between the bottom surface 44 and the second end surface 42 in the one direction. As described above, the second end surface 42 is located between the bottom surface 44 and the first heat radiation surface 11 in the one direction. Thus, the top surface 51 of the first resin member 50 is located between the bottom surface 44 and the first heat radiation surface 11 in the one direction. More specifically, the top surface 51 is located between the first end surface 12 and the second end surface 42 in the one direction. The first resin member 50 may be made of, for example, an epoxy resin.

A method of manufacturing the semiconductor device shown in FIG. 1 to FIG. 4 will be described below. First, the block body 30, the semiconductor element 20, the first heat sink 10, and the second heat sink 40 are formed, for example, by press working. In the second heat sink 40, the depressed section 43 can be formed, for example, by grinding, cutting, or etching a part of the second end surface 42.

The signal terminals 70, the first lead 80, and the second lead 81 are also formed. The first heat sink 10 on which the first lead 80 is joined may also be prepared and the second heat sink 40 on which the second lead 81 is joined may also be prepared.

The first end surface 12 of the first heat sink 10 is thermally and electrically coupled with the first surface 21 of the semiconductor element 20. The bottom surface 44 of the depressed section 43 of the second heat sink 40 is thermally and electrically coupled with the second heat sink 40.

The above-described process can be performed as follows. The semiconductor element 20 is joined to the first end surface 12 of the first heat sink 10 through the solder 60. The first lead 80 is joined on the first end surface 12. The signal terminals 70 are disposed at a periphery of the first heat sink 10, and the semiconductor element 20 and the first end portion 71 of each of the signal terminals 70 are coupled through the wire 23.

The block body 30 is joined to the semiconductor element 20 through the solder 60. The first heat sink 10, the semiconductor element 20, and the block body 30 may also be stacked through the solder 60 and may also be joined by one reflow process.

On the block body 30, the bottom surface 44 of the depressed section 43 of the second heat sink 40 is disposed through the solder 60, and the block body 30 and the second heat sink 40 are joined to each other so that the second end surface 42 of the second heat sink 40 is located between the first heat radiation surface 11 and the first end surface 12 in the one direction. By the above-described processes, the block body 30, the semiconductor element 20, the wire 23, the first end portion 71 and the stepped portion 73 of each of the signal terminals 70, the first end portion and the stepped portion of the first lead 80, and a part of the first heat sink 10 is housed in the depressed section 43. The above-described joining order is an example, and the joining order can be changed.

Then, by using the second heat sink 40 as a molding die, resin is poured in the depressed section 43 of the second heat sink 40 by potting and is solidified thereby to form the first resin member 50. The resin is poured into the second heat sink 40 as a container. Because the second heat sink 40 is used as the molding die for forming the first resin member 50, the second heat radiation surface 41 being opposite the bottom surface 44 of the depressed section 43 is not buried in the first resin member 50.

The resin is poured into the depressed section 43 of the second heat sink 40 by potting so that the first heat radiation surface 11 is exposed outside the first resin member 50 and the top surface 51 of the first resin member 50 is located between the first heat radiation surface 11 and the bottom surface 44 in the one direction. Because the top surface 51 of the first resin member 50 is located between the first heat radiation surface 11 and the bottom surface 44, the first heat radiation surface 11 is not buried in the first resin member 50.

Because each of the signal terminals 70 has the stepped portion 73, the first end portion 71 can be buried in the first resin member 50 and the second end portion 72 can be exposed outside the first resin member 50. Thus, a joint part of the wire 23 and the first end portion 71 can be bound with the first resin member 50.

As described above, the second heat sink 40 is used as the molding die and the first resin member 50 is formed so that the top surface 51 of the first resin member 50 is located between the first heat radiation surface 11 and the first end surface 12. Thus, the first resin member 50 is restricted from attaching to the first heat radiation surface 11 and the second heat radiation surface 41. Therefore, it is not necessary to grind or cut the first resin member 50, the first heat radiation surface 11, and the second heat radiation surface 41 after forming the first resin member 50.

In the semiconductor device according to the present embodiment, the second heat sink 40 has the depressed section 43, and the first resin member 50 is disposed in the depressed section 43. That is, the second heat sink 40 can function as the molding die for forming the first resin member 50 and can function as the container for housing the first resin member 50. Because the first resin member 50 is disposed in the depressed section 43 of the second heat sink 40, the second heat radiation surface 41 being opposite the bottom surface 44 of the depressed section 43 can be restricted from being buried in the first resin member 50.

Furthermore, because the top surface 51 of the first resin member 50 is located between the first heat radiation surface 11 and the first end surface 12 in the one direction, the first heat radiation surface 11 can be restricted from being buried in or covered with the first resin member 50.

Therefore, it is not necessary to grind or cut the first resin member 50, the first heat radiation surface 11, and the second heat radiation surface 41 so that the first heat radiation surface 11 and the second heat radiation surface 41 are exposed outside the first resin member 50.

(Second Embodiment)

A semiconductor device according to a second embodiment of the present invention will be described with reference to FIG. 5 to FIG. 8.

The second heat sink 40 according to the present embodiment has a plurality of grooves 45 at a plurality of portions of the second end surface 42. The grooves 45 are depressed toward the second heat radiation surface 41 so that the depressed section 43 of the second heat sink 40 communicates with an outside of the second heat sink 40. The grooves 45 are provided at portions where the signal terminal 70, the first lead 80, and the second lead 81 are disposed.

Figure 8:
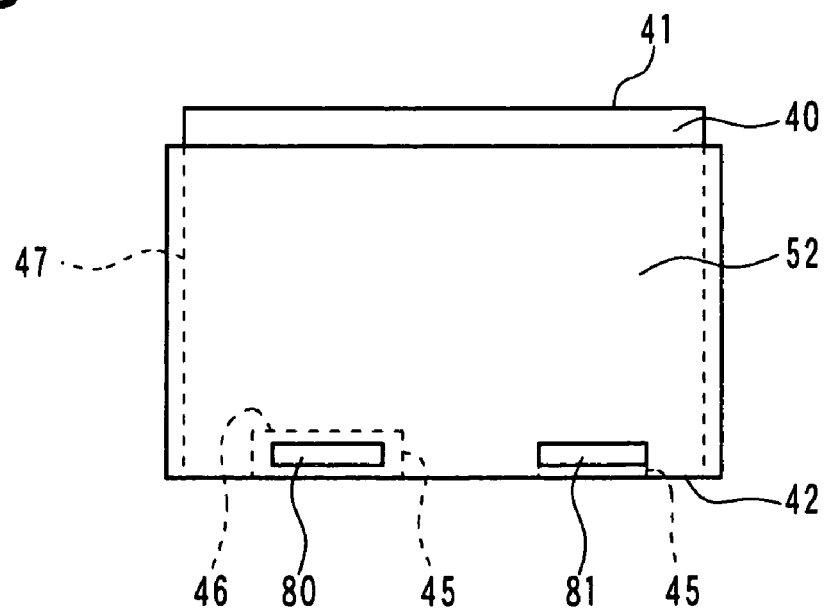
FIG. 8 is a diagram of the semiconductor device viewed from a direction shown by the arrow VIII in FIG. 5.

As shown in FIG. 8, a portion of the second lead 81 disposed in the one of the grooves 45 has a thickness same as a depth of the one of the grooves 45 so that the second lead 81 and the first lead 80 have the same height. The one of the grooves 45 is filled with the second lead 81. Thus, the depressed section 43 does not communicate with the outside of the second heat sink 40 through the groove 45 in which the second lead 81 is disposed. The second lead 81 may also have another shape.

Figure 7:
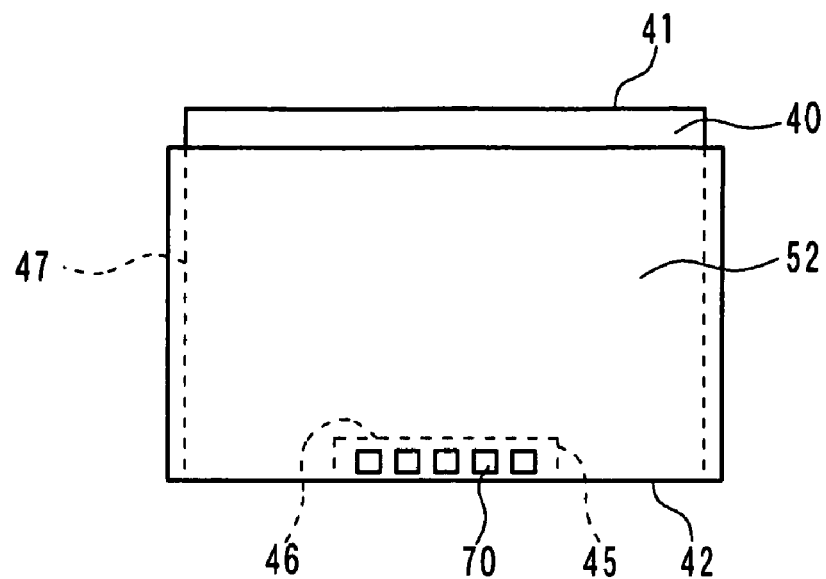
FIG. 7 is a diagram of the semiconductor device viewed from a direction shown by the arrow VII in FIG. 5.

In the example shown in FIG. 7, the second heat sink 40 has one groove 45 in which all the signal terminals 70 are disposed. The second heat sink 40 may also have grooves 45 in which the signal terminals 70 are respectively disposed.

A part of the second end portion 72 of each of the signal terminals 70 is located in the groove 45. A part of the second end portion of the first lead 80 and the second end portion of the second lead 81 are also located in the grooves 45, respectively. As shown in FIG. 7 and FIG. 8, the second end portion 72 of each of the signal terminals 70 and the second end portions of the first lead 80 and the second lead 81 are located between the second end surface 42 and bottoms 46 of the grooves 45 in the one direction. The location of the second end portion 72 of each of the signal terminals 70 and the location of the second end portions of the first lead 80 and the second lead 81 can be controlled by changing lengths of the stepped portion 73 of each of the signal terminals 70 and the stepped portion of the first lead 80.

The second lead 81 electrically couples the second heat sink 40 and an external device. Thus, the first end portion of the second lead 81 is fixed in the groove 45 as shown in FIG. 8.

In the present embodiment, the second end surface 42 and the first heat radiation surface 11 are located in the same plane. The second end portion 72 of each of the signal terminals 70 and the second end portions of the first lead 80 and the second lead 81 are housed in the groove 45 and are not disposed on the second end surface 42. Thus, by joining the semiconductor element 20, the first heat sink 10 and the second heat sink 40 through the solder 60, a thickness of the first heat sink 10 and an inclination of the first heat radiation surface 11 can be controlled by changing the depth of the depressed section 43 and the second end surface 42.

Figure 5:
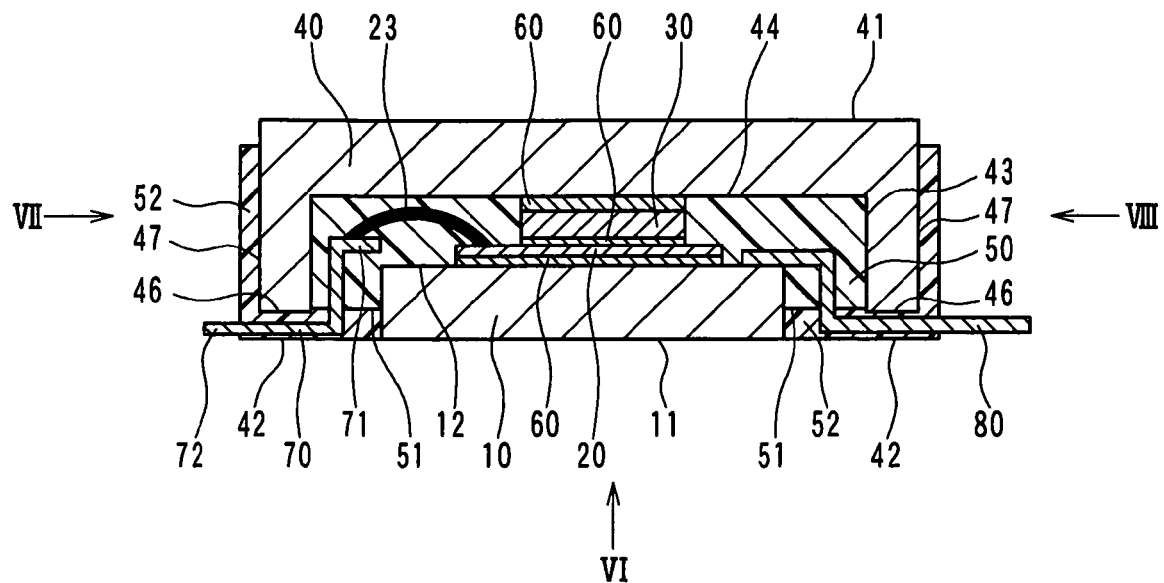
FIG. 5 is a cross-sectional view of a semiconductor device according to a second embodiment of the present invention.
Figure 6:
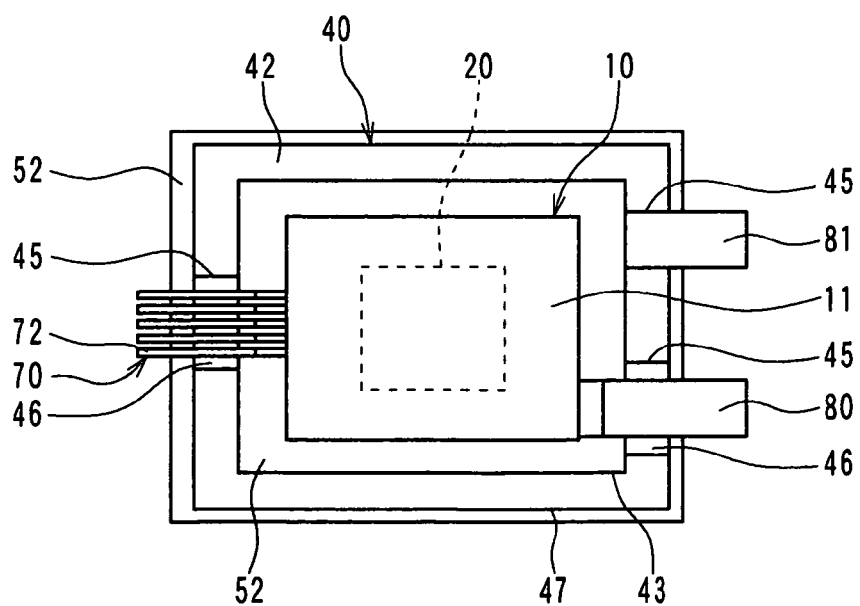
FIG. 6 is a diagram of the semiconductor device viewed from a direction shown by the arrow VI in FIG. 5.

As shown in FIG. 5, the top surface 51 of the first resin member 50 is positioned between the bottoms 46 of the grooves 45 and the bottom surface 44 of the depressed section 43 in the one direction. Thus, the first resin member 50 does not leak from the depressed section 43 through the grooves 45. The semiconductor device according to the present embodiment further includes a second resin member 52. The second resin member 52 seals the top surface 51 of the first resin member 50 and the grooves 45 in such a manner that the first heat radiation surface 11 is exposed outside the second resin member 52.

Because the second resin member 52 is located between the first heat sink 10 and the depressed section 43 of the second heat sink 40, the second resin member 52 provides insulation between the first heat sink 10 and the second heat sink 40. Furthermore, because the second resin member 52 is also located in the grooves 45, the second resin member 52 also provides insulation between the second heat sink 40 and the signal terminal 70 and insulation between the second heat sink 40 and the first lead 80.

The depressed section 43 has a wall surrounding the bottom surface 44. The second heat sink 40 has an outer wall 47. The outer wall 47 is opposite the wall of the depressed section 43 and is perpendicular to the second end surface 42 and the second heat radiation surface 41. As shown in FIG. 5 to FIG. 8, the second resin member 52 is also disposed on the outer wall 47. The second resin member 52 is provided for improving insulation between the second heat sink 40 and another member. The second resin member 52 on the outer wall 47 may be omitted. The second resin member 52 may be made of, for example, polyamide-imide or polyamide.

A method of manufacturing the semiconductor device according to the present embodiment will be described. When the second heat sink 40 is prepared, the second heat sink 40 in which the grooves 45 are previously provided may be prepared. Alternatively, the second heat sink 40 according to the first embodiment may be prepared and the grooves 45 may be provided, for example, by cutting before the second heat sink 40 is joined with the first heat sink 10.

The first heat sink 10, the semiconductor element 20, and the block body 30 are joined through the solder 60 and configurate a stacked body. The signal terminals 70 and the first lead 80 are prepared. The first end portion 71 of each of the signal terminals 70 is coupled with the semiconductor element 20 through the wire 23, and the first end portion of the first lead 80 is joined on the first end surface 12.

The stacked body is housed in the depressed section 43 of the second heat sink 40. A part of the second end portion 72 of each of the signal terminals 70 and a part of the second end portion of the first lead 80 are disposed in the grooves 45, respectively. The block body 30 and the bottom surface 44 of the depressed section 43 are joined through the solder 60 so that the second end surface 42 and the first heat radiation surface 11 are located in the same plane. By the above-described way, the first heat sink 10 and the second heat sink 40 are thermally and electrically coupled with the semiconductor element 20.

Then, resin is poured into the depressed section 43 of the second heat sink 40 by potting to form the first resin member 50. In the present case, the top surface 51 of the first resin member 50 is located between the bottoms 46 of the grooves 45 and the bottom surface 44 of the depressed section 43. Thus, the first resin member 50 does not leak from the depressed section 43 through the grooves 45.

After the first resin member 50 is formed, the top surface 51 of the first resin member 50 and the grooves 45 are covered with the second resin member 52 so that the first heat radiation surface 11 is exposed outside the second resin member 52. A top surface of the second resin member 52 is located in the same plane as the first heat radiation surface 11 or between the first heat radiation surface 11 and the bottoms 46 of the grooves 45. The second resin member 52 may also be formed on the outer wall 47 of the second heat sink 40. When the second resin member 52 is formed, the first heat radiation surface 11 and the second heat radiation surface 41 are covered with respective masks, a joined body including the first heat sink 10, the second heat sink 40, and the semiconductor element 20 may be dipped into a resin such as polyimide amide, and the resin may be cured. By the above-described way, the semiconductor device shown in FIG. 5 can be formed.

As described above, the second heat sink 40 according to the present embodiment has the grooves 45. The signal terminals 70, the first lead 80, and the second lead 81 are disposed in the grooves 45. Thus, the semiconductor element 20 can be coupled with the first heat sink 10 and the second heat sink 40 in a state where the first heat sink 10 and the second heat sink 40 are located in the same plane. Because the signal terminals 70 are not protrude from the second end surface 42 in the one direction, appearance of the semiconductor device can be improved compared with the semiconductor device according to the first embodiment.

When the second end surface 42 and the first heat radiation surface 11 are disposed on the same plane, it is not necessary to locate the second end surface 42 and the first heat radiation surface 11 at different heights. Thus, the stacked body can be easily joined to the depressed section 43 of the second heat sink 40.

On the first resin member 50, the second resin member 52 is formed so as to fill the grooves 45. Thus, the insulation between the first heat sink 10 and the second heat sink 40 and the insulation between the second heat sink 40 and the signal terminals 70 are provided.

(Third Embodiment)

Figure 9:
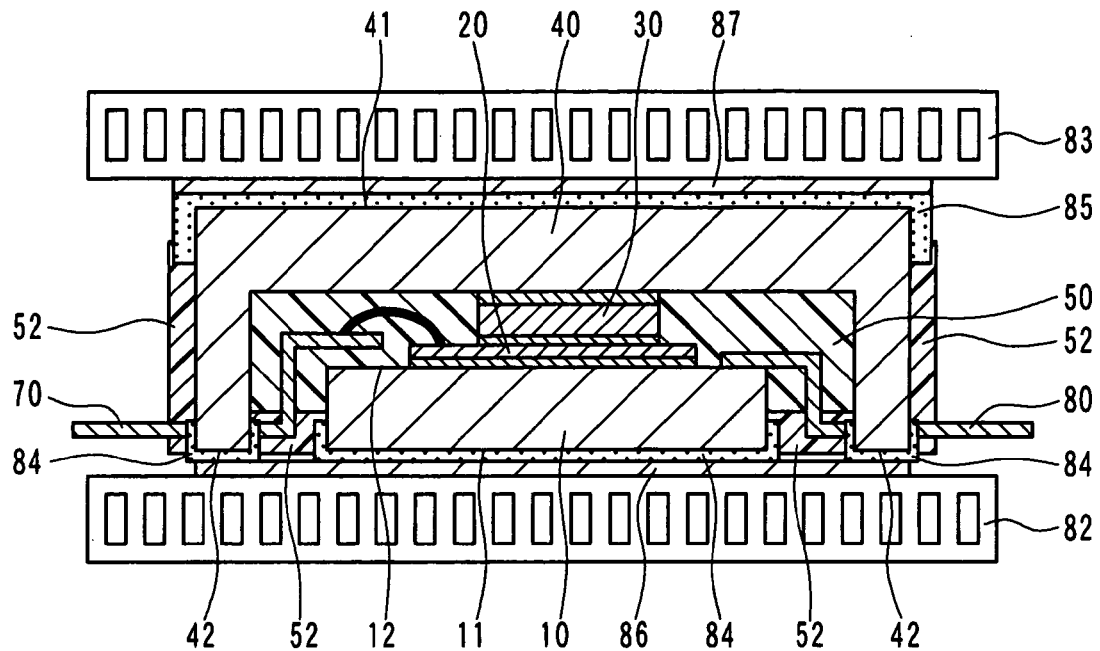
FIG. 9 is a cross-sectional view of a semiconductor device according to a third embodiment of the present invention.

A semiconductor device according to a third embodiment of the present invention will be described with reference to FIG. 9. The second heat sink 40 according to the present embodiment has the grooves 45 in a manner similar to the second heat sink 40 according to the second embodiment. However, in FIG. 9, a cross section where the grooves 45 are not provided is shown in order to show a position of the second end surface 42.

The semiconductor device according to the present embodiment is disposed between a first cooling device 82 and a second cooling device 83 so that the semiconductor device can be effectively cooled.

The semiconductor device includes a first thermally-conductive insulating member 84 and a second thermally-conductive insulating member 85. The first thermally-conductive insulating member 84 covers the first heat radiation surface 11 and the second end surface 42. The second thermally-conductive insulating member 85 covers the second heat radiation surface 41. Each of the first thermally-conductive insulating member 84 and the second thermally-conductive insulating member 85 may be made of an insulting sheet or ceramic including a high thermally-conductive filler. When each of the first thermally-conductive insulating member 84 and the second thermally-conductive insulating member 85 is made of an insulating sheet including a high thermally-conductive filler, the insulating sheet may be formed, for example, by chemical vapor deposition (CVD) or thermal splaying.

On the first thermally-conductive insulating member 84, a first electrically-conductive member 86 is disposed so as to cover the first thermally-conductive insulating member 84. The first cooling device 82 is joined on the first electrically-conductive member 86. On the second thermally-conductive insulating member 85, a second electrically-conductive member 87 is disposed, so as to cover the second thermally-conductive insulating member 85. The second cooling device 83 is joined on the second electrically-conductive member 87. Each of the first electrically-conductive member 86 and the second electrically-conductive member 87 may be made of, for example, an aluminum sheet or a copper sheet.

When the semiconductor device according to the present embodiment is manufactured, after the first resin member 50 is formed in the depressed section 43 of the second heat sink 40, the first thermally-conductive insulating member 84 is formed on the first heat radiation surface 11 and the second end surface 42. The second thermally-conductive insulating member 85 is formed on the second heat radiation surface 41. Then, a mask is formed on a surface of each of the first thermally-conductive insulating member 84 and the second thermally-conductive insulating member 85, and the second resin member 52 is formed on the first resin member 50 and the grooves 45.

Furthermore, the first electrically-conductive member 86 and the second electrically-conductive member 87 are respectively formed on the first thermally-conductive insulating member 84 and the second thermally-conductive insulating member 85, for example, by pressure welding or thermal spraying.

By joining the first cooling device 82 and the second cooling device 83 on the first electrically-conductive member 86 and the second electrically-conductive member 87, respectively, the semiconductor device can be effectively cooled.

The first thermally-conductive insulating member 84 provides insulation between the first heat sink 10 and the first cooling device 82. The second thermally-conductive insulating member 85 provides insulation between the second heat sink 40 and the second cooling device 83. A thermal resistance between the semiconductor device and the first cooling device 82 can be reduced due to the first thermally-conductive insulating member 84 and the first electrically-conductive member 86. A thermal resistance between the semiconductor device and the second cooling device 83 can be reduced due to the second thermally-conductive insulating member 85 and the second electrically-conductive member 87.

Furthermore, an electric test of whether electricity flows between the second electrically-conductive member 87 and the second heat sink 40 disposed on opposite sides of the second thermally-conductive insulating member 85 can be performed for confirming the insulation between the second heat sink 40 and the second electrically-conductive member 87.

(Fourth Embodiment)

Figure 10:
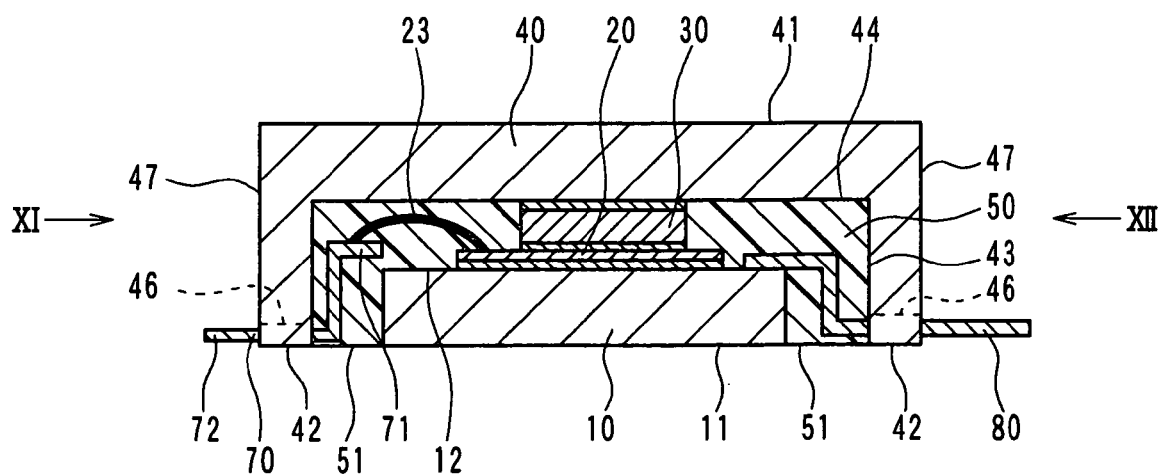
FIG. 10 is a cross-sectional view of a semiconductor device according to a fourth embodiment of the present invention.

A semiconductor device according to a fourth embodiment of the present invention will be described with reference to FIG. 10 to FIG. 12. The second heat sink 40 according to the present embodiment has the grooves 45 in a manner similar to the second heat sink 40 according to the second embodiment. However, in FIG. 10, a cross section where the grooves 45 are not provided is shown in order to show a position of the second end surface 42.

The second end surface 42 and the first heat radiation surface 11 are located in the same plane. The second heat sink 40 has the grooves 45 at position corresponding to the signal terminals 70, the first lead 80, and the second lead 81. A part of the second end portion 72 of each of the signal terminals 70 and a part of the second end portion of the first lead 80 are disposed in the grooves 45.

A part of the second lead 81 located in one of the grooves 45 has a thickness same as a depth of the one of the grooves 45 so that the one of the grooves 45 is filled with the second lead 81.

Figure 11:
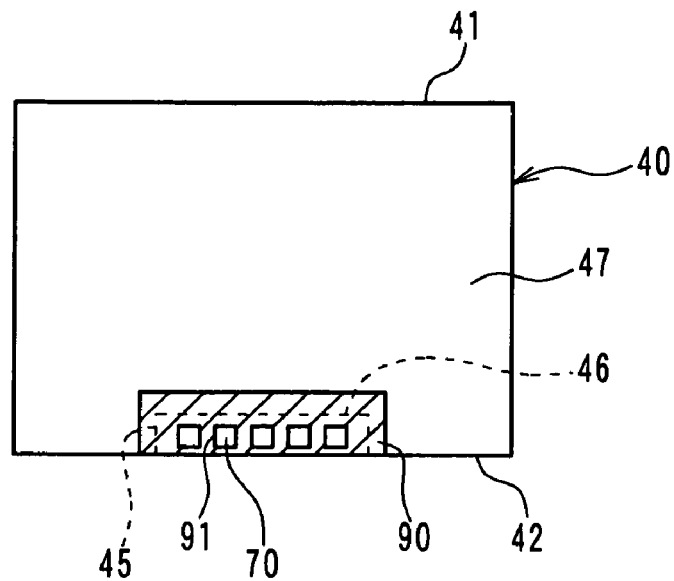
FIG. 11 is a diagram of the semiconductor device viewed from a direction shown by the arrow XI in FIG. 10.
Figure 12:
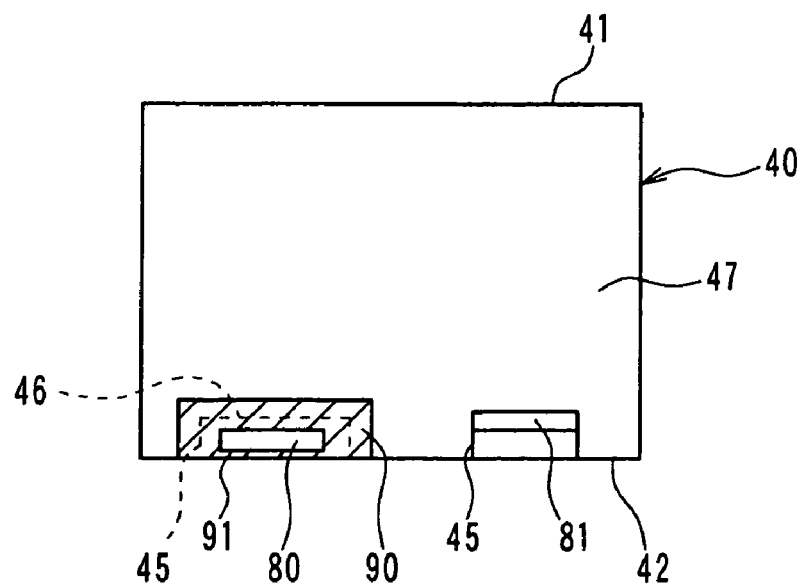
FIG. 12 is a diagram of the semiconductor device viewed from a direction shown by the arrow XII in FIG. 10.

As shown in FIG. 11 and FIG. 12, the second heat sink 40 has heat contractive members 90 on the outer wall 47 being opposite the wall of the depressed section 43. In FIG. 11 and FIG. 12, the heat contractive members 90 are shown by shaded regions.

One of the heat contractive members 90 is attached to the outer wall 47 so as to cover the groove 45 in which the signal terminals 70 are housed. The other one of the heat contractive members 90 is attached to the outer wall 47 so as to cover the groove 45 in which the first lead 80 is disposed. A plurality of through holes 91 larger than a cross-sectional dimension of each of the signal terminals 70 and the first lead 80 is provided in the heat contractive members 90, and the second end portion 72 of each of the signal terminals 70 and the second end portion of first lead 80 is inserted into corresponding one of the through holes 91. When the heat contractive members 90 are heated and are contracted, a dimension of each of the through holes 91 is reduced. Thus, the heat contractive member 90 can firmly fit the second end portion 72 of each of the signal terminals 70.

In the semiconductor device according to the present embodiment, the first resin member 50 is formed in the depressed section 43 and the grooves 45 of the second heat sink 40. The top surface 51 of the first resin member 50 is located in the same plane as the second end surface 42 and the first heat radiation surface 11. Thus, the first resin member 50 fills the depressed section 43 and the grooves 45.

Because the heat contractive members 90 are attached on the outer wall of the second heat sink 40 so as to block the grooves 45, the heat contractive members 90 can function as banks of the grooves 45. Thus, even when the top surface 51 of the first resin member 50 is located between the bottoms 46 of the grooves 45 and the second end surface 42 in the one direction, the first resin member 50 does not leak out of the second heat sink 40 through the grooves 45. Therefore, the first resin member 50 can provide insulation between the signal terminals 70 and the second heat sink 40 and insulation between the first lead 80 and the second heat sink 40.

A method of manufacturing the semiconductor device according to the present embodiment will be described below. The first heat sink 10, the semiconductor element 20, and the block body 30 are stacked so as to configure the stacked body, and the semiconductor element 20 and the first end portion 71 of each of the signal terminals 70 are coupled through the wire 23. The first lead 80 is joined on the first end surface 12 of the first heat sink 10. The second heat sink 40 having the grooves 45 is prepared and the second lead 81 is joined to the second heat sink 40.

The stacked body is housed in the depressed section 43 of the second heat sink 40. A part of the second end portion 72 of each of the signal terminals 70 and a part of the second end portion of the first lead 80 are housed in the corresponding grooves 45. The block body 30 and the bottom surface 44 of the depressed section 43 are joined through the solder 60 so that the second end surface 42 and the first heat radiation surface 11 are located in the same plane.

Then, the heat contractive members 90 having the through holes 91 are prepared. The second end portion 72 of each of the signal terminals 70 are inserted in the corresponding one of the through holes 91 of the heat contractive member 90, and the heat contractive member 90 is attached on the outer wall 47 of the second heat sink 40 so as to block the groove 45. Furthermore, the second end portion of the first lead 80 is inserted in the through hole 91 of the heat contractive member 90, and the heat contractive member 90 is attached to the outer wall 47 of the second heat sink 40 so as to block the groove 45.

Next, the heat contractive members 90 are heated and are contracted so that clearances between the through holes 91 and the second end portions 72 of the signal terminals 70 and a clearance between the through hole 91 and the second end portion of the first lead 80 are filled, and the heat contractive member 90 firmly fits the second end portions 72 of the signal terminals 70. Thus, a communication between the depressed section 43 and an outside of the second heat sink 40 through the grooves 45 is blocked.

Then, resin for forming the first resin member 50 is poured into the depressed section 43 and grooves 45 by potting, and the depressed section 43 and the grooves 45 are sealed with first resin member 50. As a result, the semiconductor device shown in FIG. 10 is completed.

In the semiconductor device according to the present embodiment, the grooves 45 are blocked with the heat contractive members 90. Because the heat contractive members 90 can function as banks for blocking a communication between the grooves 45 and the outside of the second heat sink 40, the first resin member 50 does not leak out of the second heat sink 40 through the grooves 45. In addition, because the first resin member 50 does not leak out of the second heat sink 40 through the grooves 45, the top surface 51 of the first resin member 50 can be located between the bottoms 46 of the grooves 45 and the second end surface 42 in the one direction.

Furthermore, because the first resin member 50 is also formed in the grooves 45, the first resin member 50 can provide the insulation between the second heat sink 40 and the signal terminals 70 and the insulation between the second heat sink 40 and the first lead 80.

(Fifth Embodiment)

Figure 13:
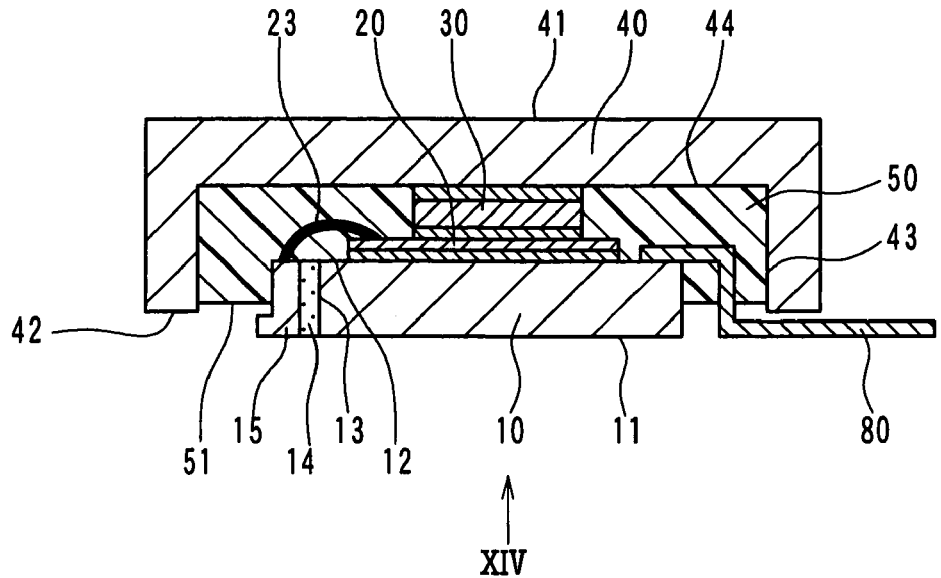
FIG. 13 is a cross-sectional view of a semiconductor device according to a fifth embodiment of the present invention.
Figure 14:
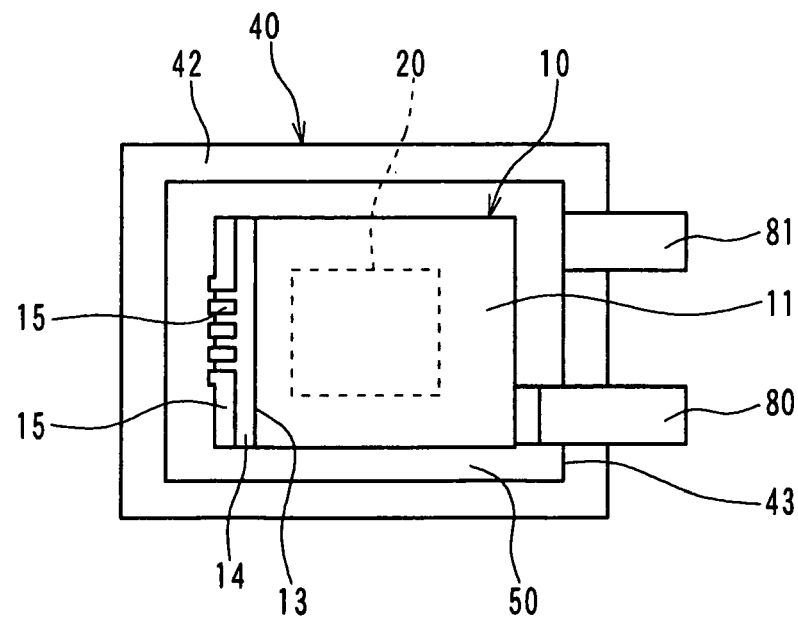
FIG. 14 is a diagram of the semiconductor device viewed from a direction shown by the arrow XIV in FIG. 13.

A semiconductor device according to a fifth embodiment of the present invention will be described with FIG. 13 and FIG. 14.

The first heat sink 10 has a first side surface 13 that is perpendicular to the first heat radiation surface 11 and the first end surface 12. On the first side surface 13, a first insulating body 14 is disposed. On the first insulating body 14, a terminal part 15 is disposed. The terminal part 15 is provided for electrically coupling the semiconductor element 20 and an external device. The first heat radiation surface 11, the first insulating body 14, and the terminal part 15 are located in the same plane.

The semiconductor element 20 and the terminal part 15 are coupled through the wire 23. A joint portion between the wire 23 and the terminal part 15 and a joint portion between the wire 23 and the semiconductor element 20 are sealed with the first resin member 50.

The terminal part 15 is integrated with the first heat sink 10 through the first insulating body 14. Thus, as shown in FIG. 14, the terminal part 15 is located within a range of the depressed section 43 of the second heat sink 40. The terminal part 15 is joined with, for example, a wire from the outside of the semiconductor device.

Also in the semiconductor device according to the present embodiment, a signal voltage of the semiconductor element 20 can be detected through the terminal part 15 without using the signal terminals 70 described in the first embodiment.

(Sixth Embodiment)

A manufacturing method of a semiconductor device according to a sixth embodiment of the present invention will be described with reference to FIG. 15. In the present embodiment, the first resin member 50 is formed by heating and curing powdered resin.

In a manufacturing method of the semiconductor device according to the present embodiment, after each of the components are joined through the solder 60, powdered resin is put in the depressed section 43 of the second heat sink 40.

Then, a buffer tape 92 is attached on the second end surface 42 and the first heat radiation surface 11 which are located in the same plane. The buffer tape 92 absorbs unevenness of the second end surface 42 and unevenness of the first heat radiation surface 11 so that a difference in flatness between the second end surface 42 and the first heat radiation surface 11 can be disregarded.

Then, while the second heat sink 40 and the buffer tape 92 are pressed in a molding tool 100, the powdered resin is heated and cured so as to form the first resin member 50. The powdered resin can be treated easily. In the present method, the powdered resin is put in the depressed section 43 of the second heat sink 40 and is cured. Thus, a device for potting is not required.

Figure 15:
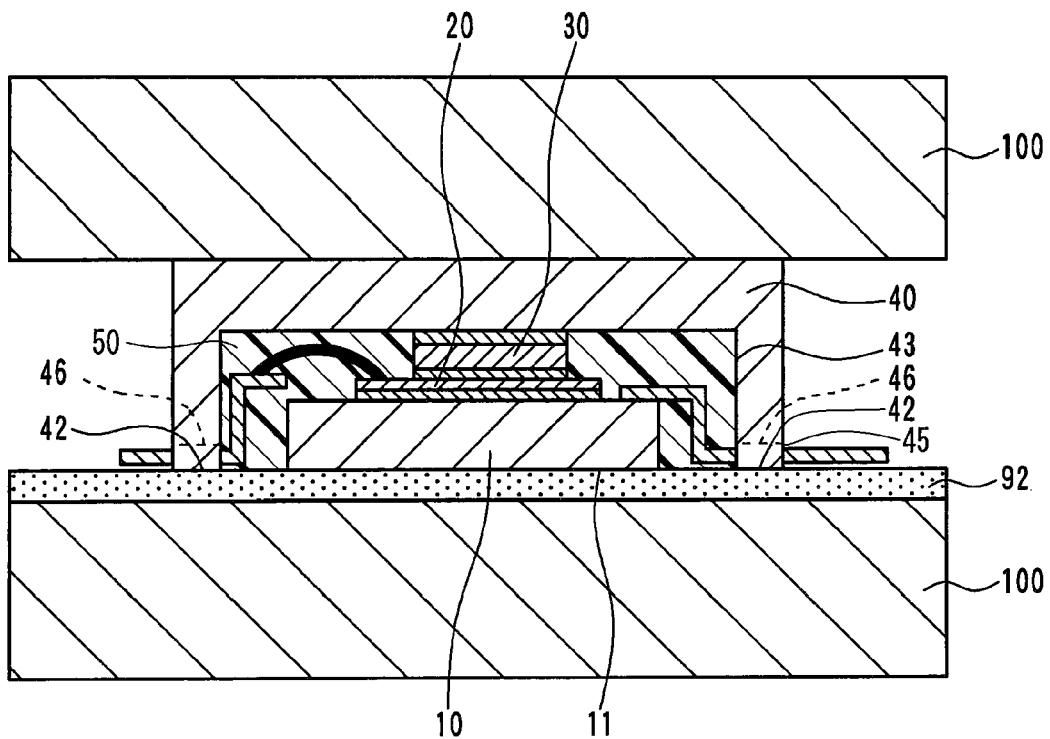
FIG. 15 is a diagram showing a manufacturing process of a semiconductor device according to a sixth embodiment of the present invention.

In FIG. 15, the second heat sink 40 is illustrated above the buffer tape 92. Because the second heat sink 40 is used as a container of the powdered resin, even if the second heat sink 40 has the grooves 45, the first resin member 50 can be restricted from leaking out of the grooves 45 by controlling the amount of the powdered resin. In a case where the heat contractive members 90 are used, the first resin member 50 can be prevented from leaking out of the grooves 45 by the heat contractive members 90. After forming the first resin member 50, the second resin member 52 may be formed on the first resin member 50.

(Seventh Embodiment)

A manufacturing method of a semiconductor device according to a seventh embodiment of the present invention will be described with reference to FIG. 16. In the present embodiment, the first resin member 50 is formed by transfer molding.

The buffer tape 92 is attached on the second end surface 42 and the first heat radiation surface 11 in a manner similar to the sixth embodiment. The joined body, which includes the first heat sink 10 and the second heat sink 40 and is attached with the buffer tape 92, is disposed in a molding tool 110 for transfer molding.

Figure 16:
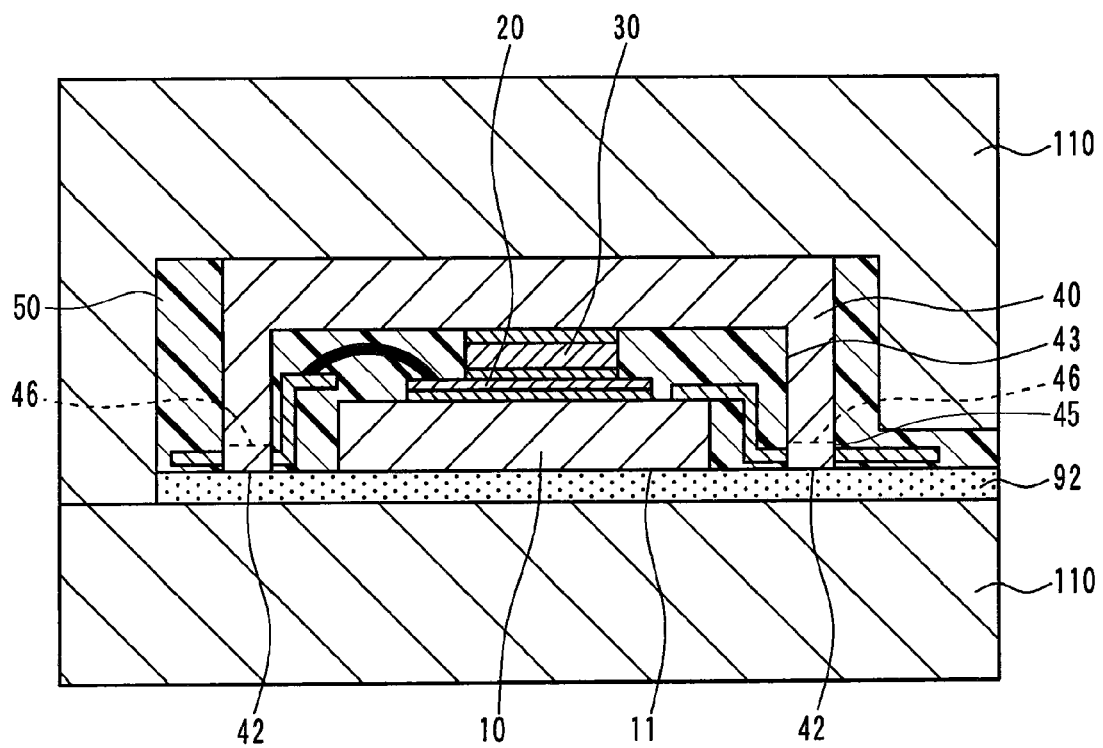
FIG. 16 is a diagram showing a manufacturing process of a semiconductor device according to a seventh embodiment of the present invention.

Although the molding tool 110 is simplified in FIG. 16, a structure of the molding tool 110 is set so that the first resin member 50 is not attached to the signal terminals 70, the first lead 80, and the second lead 81.

Then, resin for forming the first resin member 50 is poured into the molding tool 110. The resin is poured into the depressed section 43 of the second heat sink 40 through the grooves 45. As a result, the first resin member 50 is formed in the depressed section 43 by transfer molding.

(Eighth Embodiment)

Figure 17:
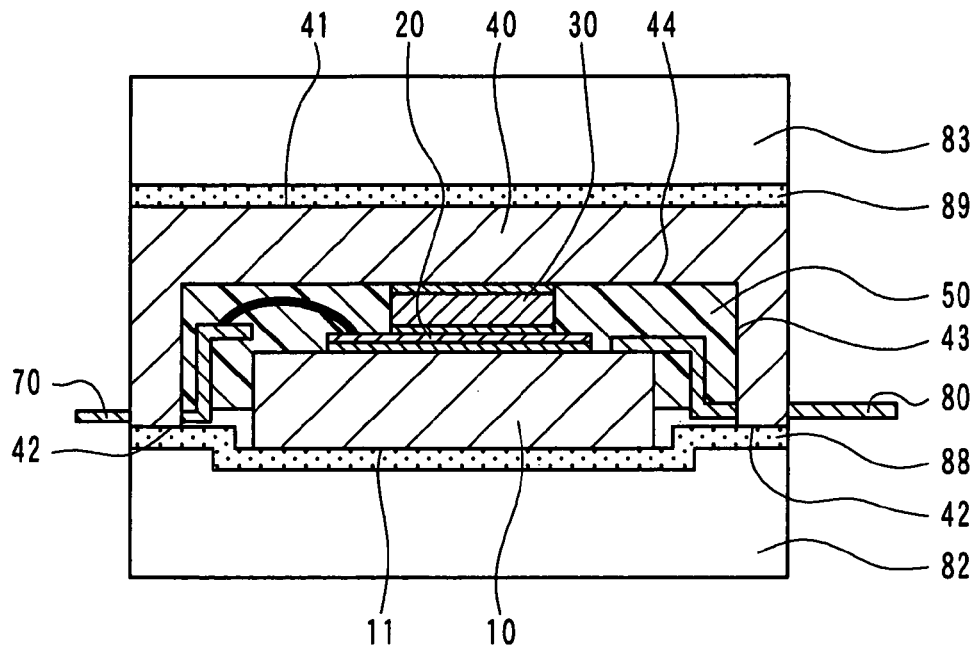
FIG. 17 is a cross-sectional view of a semiconductor device according to an eighth embodiment of the present invention.

A semiconductor device according to an eighth embodiment of the present invention will be described with reference to FIG. 17. As shown in FIG. 17, the first heat radiation surface 11 of the first heat sink 10 is located outside the second end surface 42 of the of the second heat sink 40. In other words, the second end surface 42 is located between the bottom surface 44 of the depressed section 43 and the first heat radiation surface 11 in the one direction. In other words, the first heat radiation surface 11 protrudes from the second end surface 42 with reference to the bottom surface 44 of the depressed section 43.

The semiconductor device in which the first heat radiation surface 11 and the second end surface 42 are located in the above-described manner is disposed, between the first cooling device 82 and the second cooling device 83. The first insulation sheet 88 is disposed between the first heat sink 10 and the first cooling device 82 to provide insulation between first heat sink 10 and the first cooling device 82. The second insulation sheet 89 is disposed between the second heat sink 40 and the second cooling device 83 to provide insulation between the second heat sink 40 and the second cooling device 83. The first thermally-conductive insulating member 84 and the second thermally-conductive insulating member 85 may be used to perform the functions of the first insulating sheet 88 and the second insulating sheet 89.

The second heat radiation surface 41 of the second heat sink 40 is thermally coupled with the second cooling device 83 through the second insulating sheet 89. The first cooling device 82 has a depressed surface that is depressed toward an opposite side from the semiconductor device. The first insulating sheet 88 is disposed on the depressed surface of the first cooling device 82. The first heat sink 10 and the first cooling device 82 are thermally coupled through the first insulating sheet 88. In addition, the second end surface 42 of the second heat sink 40 and the first cooling device 82 are thermally coupled through the first insulating sheet 88. By using the first cooling device 82 having a depressed shape, the semiconductor device can be effectively cooled.

(Ninth Embodiment)

Figure 18:
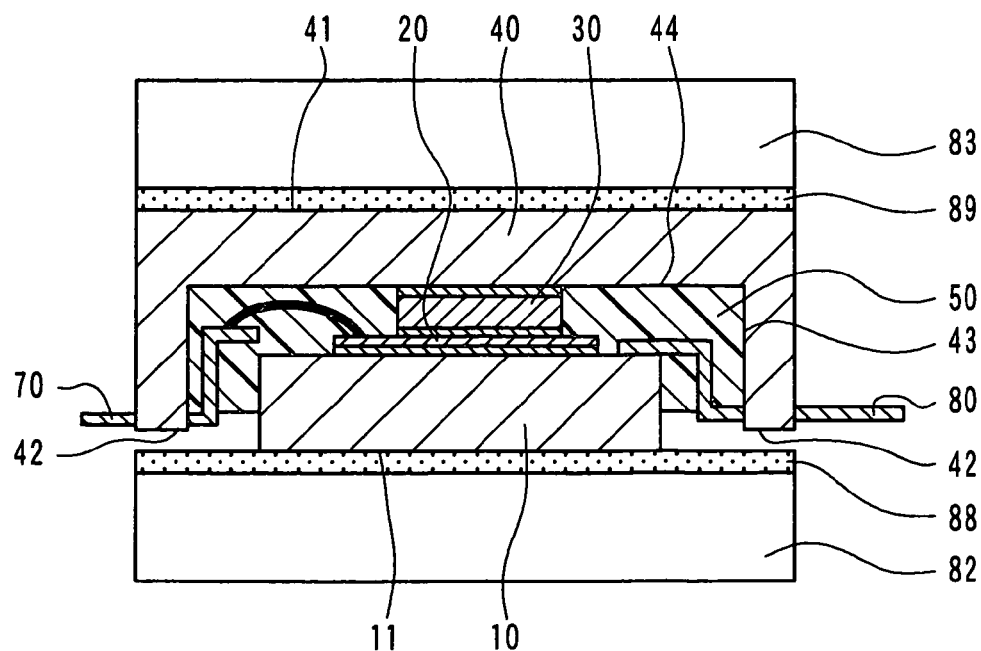
FIG. 18 is a cross-sectional view of a semiconductor device according to a ninth embodiment of the present invention.

A semiconductor device according to a ninth embodiment of the present invention will be described with reference to FIG. 18. In the present embodiment, the first heat radiation surface 11 protrudes outside the second end surface 42. In other words, the second end surface 42 is located between the bottom surface 44 of the depressed section 43 and the first hear radiation surface 11, and the first heat radiation surface 11 is the outermost surface. Thus, the first heat sink 10 may be thermally coupled with a first cooling device 82 having a plate shape.

(Tenth Embodiment)

Figure 19:
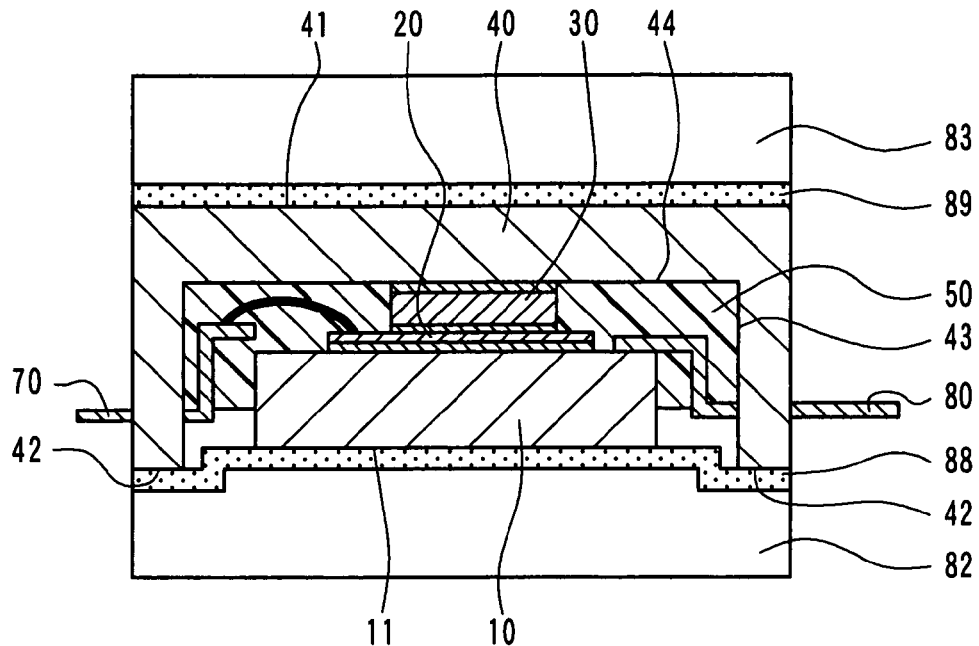
FIG. 19 is a cross-sectional view of a semiconductor device according to a tenth embodiment of the present invention.

A semiconductor device according to a tenth embodiment of the present invention will be described with reference to FIG. 19. In the present embodiment, the second end surface 42 of the second heat sink 40 is located outside the first heat radiation surface 11 of the first heat sink 10. In other words, the first heat radiation surface 11 is located between the bottom surface 44 of the depressed section and the second end surface 42 in the one direction. In other words, the second end surface 42 protrudes from the first heat radiation surface 11 with reference to the bottom surface 44 of the depressed section 43.

The second heat radiation surface 41 of the second heat sink 40 is thermally coupled with the second cooling device 83 through the second insulating sheet 89. The first cooling device 82 has a protruding surface that protrudes toward the semiconductor device.

The first insulating sheet 88 is disposed on the first cooling device 82. The second end surface 42 and the first cooling device 82 are thermally coupled through the first insulating sheet 88. In addition, the first heat sink 10 is thermally coupled with the first cooling device 82 through the first insulating sheet 88. By using the first cooling device 82 having a protruding shape, the semiconductor device can be cooled effectively.

(Eleventh Embodiment)

Figure 20:
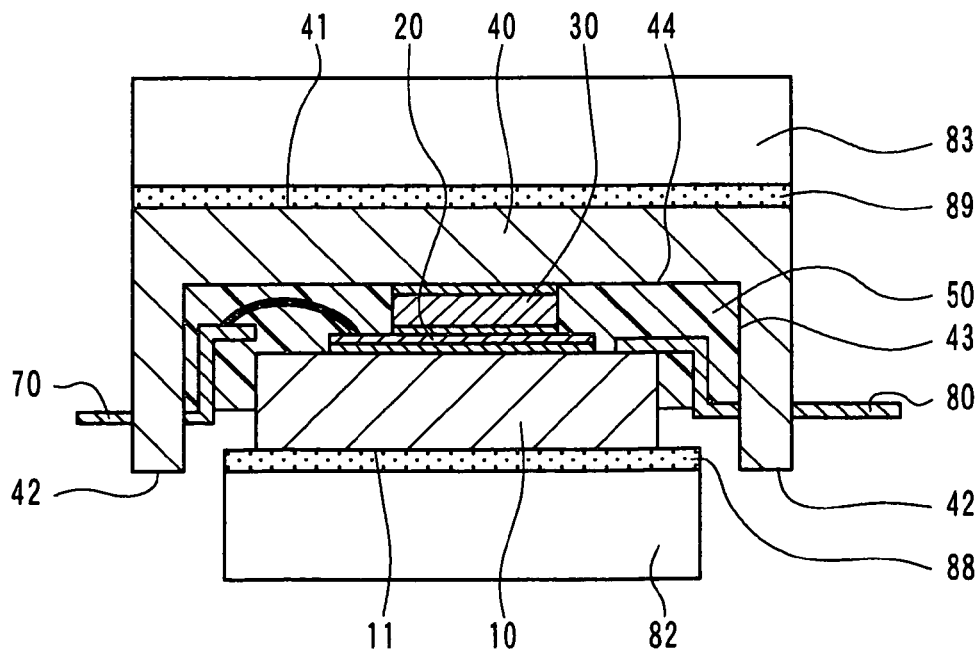
FIG. 20 is a cross-sectional view of a semiconductor device according to an eleventh embodiment of the present invention.

A semiconductor device according to an eleventh embodiment of the present invention will be described with reference to FIG. 20. In the present embodiment, the second end surface 42 protrudes from the first heat radiation surface 11 in a manner similar to the tenth embodiment. In other words, the heat radiation surface 11 is located between the bottom surface 44 of the depressed section 43 and the second end surface 42 in the one direction, and the second end surface 42 is the outermost surface. In a planar direction of the first heat radiation surface 11, a dimension of the first cooling device 82 is smaller than a dimension of the bottom surface 44 of the depressed section 43 and is larger than the first heat radiation surface 11. Thus, the first cooling device 82 having a planar shape can be thermally coupled with the first heat sink 10.

(Twelfth Embodiment)

A semiconductor device according to a twelfth embodiment of the present embodiment will be described with reference to FIG. 21. In the present embodiment, the top surface 51 of the first resin member 50 is located outside the stepped portion 73 of each of the signal terminals 70. In other words, the first resin member 50 fully covers the stepped portion 73 of each of the signal terminals 70.

The grooves 45 provided in the second heat sink 40 are filled with the first resin member 50. The heat contractive members 90 are disposed on the outer wall 47 of the second heat sink 40 so as to block the grooves 45. Thus, the first resin member 50 is restricted from leaking out of the grooves 45. In FIG. 21, the heat contractive members 90 are not shown.

In a planar direction of the second heat radiation surface 41, a dimension of the second cooling device 83 is larger than a dimension of the second heat radiation surface 41. The first heat radiation surface 11 of the first heat sink 10 is located outside the second end surface 42 of the second heat sink 40. In other words, the second end surface 42 is located between the bottom surface 44 of the depressed section 43 and the first heat radiation surface 11 in the one direction.

Because the first resin member 50 fully covers the stepped portion 73 of each of the signal terminals 70, the signal terminals 70 can be fixed with certainty and the strength of the signal terminals 70 can be improved.

Figure 21:
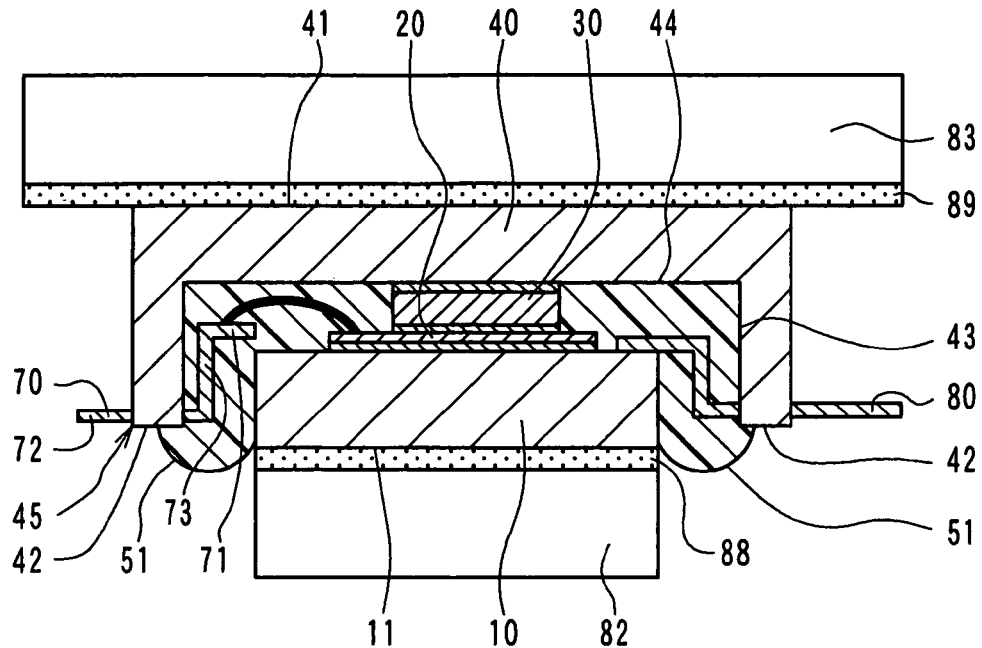
FIG. 21 is a cross-sectional view of a semiconductor device according to a twelfth embodiment of the present invention.

In FIG. 21, the top surface 51 of the first resin member 50 has a convex shape protruding from the second end surface 42 of the second heat sink 40, as an example. As long as the stepped portion 73 of each of the signal terminals 70 is fully covered with the first resin member 50, the top surface 51 may also have a concave shape.

In the example shown in FIG. 21, the grooves 45 provided in the second heat sink 40 is filled with the first resin member 50. When the first resin member 50 is formed in such a manner that the top surface 51 connects on a sidewall of the depressed section 43, the grooves 45 may also not be filled with the first resin member 50 and the heat contractive members 90 may also not be provided.

(Thirteenth Embodiment)

Figure 22:
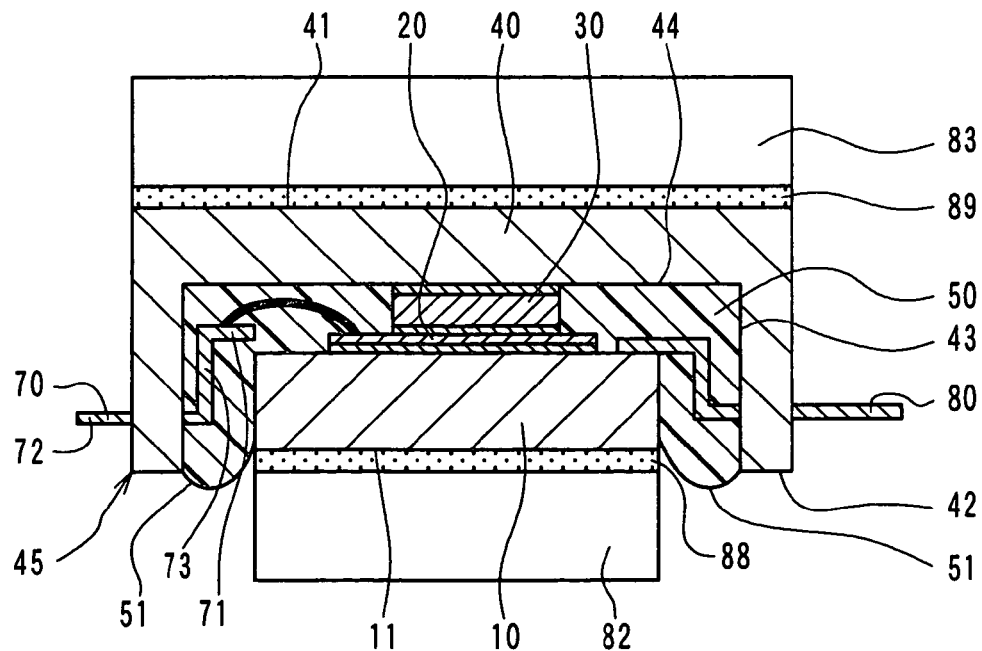
FIG. 22 is a cross-sectional view of a semiconductor device according to a thirteenth embodiment of the present invention.

A semiconductor device according to a thirteenth embodiment of the present invention will be described with reference to FIG. 22. The stepped portion 73 of each of the signal terminals 70 is fully covered with the first resin member 50.

In the planar direction of the second heat radiation surface 41 of the second heat sink 40, a dimension of a surface of the second cooling device 83 being opposite the second heat radiation surface 41 is same as the dimension of the second heat radiation surface 41. The second end surface 42 of the second heat sink 40 is located outside the first heat radiation surface 11 of the first heat sink 10. In other words, the first heat radiation surface 11 is located between the bottom surface 44 of the depressed section 43 and the second end surface 42 in the one direction.

Also in the semiconductor device according to the present embodiment, the first resin member 50 fully covers the stepped portion 73 of each of the signal terminals 70. Thus, the signal terminals 70 can be fixed with certainty and the strength of the signal terminals 70 can be improved.

(Other Embodiments)

Although the present invention has been fully described in connection with the exemplary embodiments thereof with reference to the accompanying drawings, it is to be noted that various changes and modifications will become apparent to those skilled in the art.

In each of the above-described embodiments except for the fifth embodiment, the semiconductor device includes the signal terminals 70. Depending on the semiconductor element 20, the signal terminals 70 may be omitted. For example, when the semiconductor element 20 includes a diode, the semiconductor device is configured so that electric current flows between the first heat sink 10 and the second heat sink 40. In such a case, the signal terminals 70 may be omitted. The configurations of the semiconductor devices described above are only examples. For example, the block body 30 may be omitted. When the first heat radiation surface 11 of the first heat sink 10 and the second heat radiation surface 41 of the second heat sink 40 are used as electrode surfaces, the first lead 80 and the second lead 81 may be omitted.

In the semiconductors device according to the first embodiment and the fifth embodiment, the second end surface 42 of the second heat sink 40 and the first heat radiation surface 11 of the first heat sink 10 are not located in the same plane. The semiconductor devices may also be modified in such a manner that the second end surface 42 and the first heat radiation surface 11 are located in the same plane. In the semiconductor devices according to the second embodiment, the third embodiment, the fourth embodiment, the sixth embodiment, and the seventh embodiment, the second end surface 42 of the second heat sink 40 and the first heat radiation surface 11 of the first heat sink 10 are located in the same plane. The semiconductor devices may also be modified in such a manner that the second end surface 42 and the first heat radiation surface 11 are located in different planes.

In the semiconductor device according to the second embodiment, the second resin member 52 is disposed on the first resin member 50 for improving insulation of the signal terminals 70. The second resin member 52 may be omitted.

The semiconductor device according to the third embodiment may be modified in such a manner that the heat contractive members 90 are disposed on the outer wall 47 of the second heat sink 40 so that the second resin member 52 does not leak out of the grooves 45. The semiconductor device according to the third embodiment may also be modified in such a manner that the heat contractive members 90 are disposed on the outer wall 47 of the second heat sink 40 and the depressed section 43 and the grooves 45 are filled only with the first resin member 50. The semiconductor device according to the third embodiment may also be modified in such a manner that, without disposing the heat contractive members 90 on the outer wall 47 of the second heat sink 40, the top surface 51 is located between the bottoms 46 of the grooves 45 and the bottom surface 44 of the depressed section 43, the depressed section 43 is sealed only with the first resin member 50, and the first thermally-conductive insulating member 84, the second thermally-conductive insulating member 85, the first electrically-conductive member 86, and the second electrically-conductive member 87 are disposed.

In the semiconductor device according to the fourth embodiment, the depressed section 43 of the second heat sink 40 is sealed only with the first resin member 50. The semiconductor device according to fourth embodiment may be modified in such a manner that the heat contractive members 90 are disposed on the outer wall 47 of the second heat sink 40, the top surface 51 of the first resin member 50 is located between the bottoms 46 of the grooves 45 and the bottom surface 44 of the depressed section 43, and the second resin member 52 is disposed on the first resin member 50. In the present case, the signal terminals 70 can be sealed with the second resin member 52 while restricting the second resin member 52 from leaking out of the grooves 45. In the present case, the top surface of the second resin member 52 may be located in the same plane with the first heat radiation surface 11 or between the bottom surface 44 and the first heat radiation surface 11 so that the first heat radiation surface 11 can come in contact with the first cooling device 82 without interfered by the second resin member 52.

In the semiconductor devices according to the ninth embodiment, the eleventh embodiment, the twelfth embodiment, and the thirteenth embodiment, the second end portion 72 of each of the signal terminals 70 is disposed in the groove 45 of the second heat sink 40. The semiconductor devices may be modified in such a manner that the second end portion 72 of each of the signal terminals 70 is located between the second end surface 42 and the first heat radiation surface 11 in the one direction, as shown in FIG. 1.

In the semiconductor devices according to the twelfth embodiment and the thirteenth embodiment, the stepped portion 73 of each of the signal terminals 70 is fully covered with the first resin member 50. The stepped portion of the first lead 80 and the stepped portion of the second lead 81 may also be fully covered with the first resin member 50.

The configurations of the above-described embodiments are examples, and the shapes and the materials may be changed. The above-described embodiments can be combined.

What is claimed is:

1. A semiconductor device comprising:
    a semiconductor element having a first surface and a second surface, the second surface being opposite the first surface in one direction;
    a first heat sink having a first heat radiation surface and a first end surface, the first end surface being opposite the first heat radiation surface in the one direction, the first end surface thermally and electrically coupled with the first surface of the semiconductor element;
    a second heat sink having a second heat radiation surface, a second end surface, and a depressed section, the second end surface being opposite the second heat radiation surface in the one direction, the second end surface surrounding the depressed section, the depressed section depressed toward the second heat radiation surface and having a bottom surface, the bottom surface thermally and electrically coupled with the second surface of the semiconductor element; and
    a resin member disposed in the depressed section and sealing the semiconductor element, the first heat sink, and the second heat sink in such a manner that the first heat radiation surface is exposed outside the resin member,
    wherein the depressed section of the second heat sink contains the entire first resin member.

2. The semiconductor device according to claim 1, further comprising
    a signal terminal having a first end portion, a second end portion, and a stepped portion, the first end portion electrically coupled with the semiconductor element, the second end portion configured to be electrically coupled with an external device, the stepped portion being a bent portion between the first end portion and the second end portion, wherein
    the first end portion of the signal terminal is located in the depressed section, and
    the resin member seals a part of the signal terminal located in the depressed section.

3. The semiconductor device according to claim 2, wherein:
    the second heat sink has a groove on the second end surface;
    the groove is depressed toward the second heat radiation surface;
    the depressed section communicates with an outside of the second heat sink through the groove;
    a part of the second end portion of the signal terminal is located in the groove; and
    the second end portion is located between the second end surface and a bottom of the groove in the one direction.

4. The semiconductor device according to claim 3, further comprising another resin member, wherein
    the resin member has a top surface located between the bottom of the groove and the bottom surface of the depressed section in the one direction, and
    the another resin member seals the top surface of the resin member and the groove in such a manner that the first heat radiation surface is exposed outside the another resin member.

5. The semiconductor device according to claim 4, further comprising a heat contractive member, wherein:
    the depressed section has a wall surrounding the bottom surface;
    the second heat sink has an outer wall being opposite the wall of the depressed section;
    the heat contractive member is disposed on the outer wall so as to block the groove;
    the second end portion of the signal terminal penetrates through the heat contractive member; and
    the heat contractive member is contracted by heating and firmly fits the second end portion.

6. The semiconductor device according to claim 4, wherein
    the another resin member has a top surface located in a same plane as the first heat radiation surface or between the first heat radiation surface and the bottom surface of the depressed section in the one direction.

7. The semiconductor device according to claim 3, further comprising a heat contractive member, wherein:
    the depressed section has a wall surrounding the bottom surface;
    the second heat sink has an outer wall being opposite the wall of the depressed section;
    the heat contractive member is disposed on the outer wall so as to block the groove;
    the second end portion of the signal terminal penetrates through the heat contractive member;
    the heat contractive member is contracted by heating and firmly fits the second end portion; and
    the resin member seals the depressed section and the groove.

8. The semiconductor device according to claim 3, wherein
    the resin member fully covers the stepped portion of the signal terminal.

9. The semiconductor device according to claim 3, further comprising:

a first thermally-conductive insulating member covering the first heat radiation surface and the second end surface;

a second thermally-conductive insulating member covering the second heat radiation surface;

a first electrically-conductive member covering the first thermally-conductive insulating member and configured to be joined with a first cooling device; and a second electrically-conductive member covering the second thermally-conductive insulating member and configured to be joined with a second cooling device.

10. The semiconductor device according to claim 1, wherein the first heat sink includes:
a side surface being perpendicular to the first heat radiation surface and the first end surface;
an insulating body disposed on the side surface; and
a terminal part disposed on the insulating body, the terminal part electrically coupled with the semiconductor element, and the terminal part configured to be electrically coupled with an external device.

11. The semiconductor device according to claim 1, wherein
the second end surface is located in a same plane as the first heat radiation surface or between the first heat radiation surface and the bottom surface of the depressed section in the one direction.

12. The semiconductor device according to claim 1, wherein
the first heat radiation surface is located in a same plane as the second end surface or between the second end surface and the bottom surface of the depressed section in the one direction.

13. The semiconductor device according to claim 1, wherein
the resin member has a top surface; and
the top surface is located in a same plane as the first heat radiation surface or between the first heat radiation surface and the bottom surface of the depressed section in the one direction.

14. A method of manufacturing a semiconductor device, comprising:
forming a semiconductor element having a first surface and a second surface, the second surface being opposite the first surface;
forming a first heat sink having a first heat radiation surface and a first end surface, the first end surface being opposite the first heat radiation surface;
forming a second heat sink having a second heat radiation surface, a second end surface, and a depressed section, the second end surface being opposite the second heat radiation surface, the second end surface surrounding the depressed section, the depressed section depressed toward the second heat radiation surface and having a bottom surface;
coupling the semiconductor element with the first heat sink and the second heat sink, the coupling the semiconductor element including thermally and electrically coupling the first surface of the semiconductor element with the first end surface of the first heat sink and thermally and electrically coupling the second surface of the semiconductor element with the bottom surface of the depressed section; and
forming a resin member entirely in the depressed section and sealing the semiconductor element, the first heat sink, and the second heat sink with the resin member.

15. The method according to claim 14, wherein the coupling the semiconductor element further includes:

forming a signal terminal having a first end portion, a second end portion, and a stepped portion, the stepped portion being a bent portion between the first end portion and the second end portion;

electrically coupling the first end portion of the signal terminal with the semiconductor element; and disposing the first end portion of the signal terminal in the depressed section of the second heat sink, wherein the forming the resin member includes sealing a part of the signal terminal located in the depressed section with the resin member.

16. The method according to claim 15, wherein
the forming the second heat sink includes providing a groove that is depressed toward the second heat radiation surface on the second end surface so that the depressed section communicates with an outside of the second heat sink through the groove, and
the coupling the semiconductor element further includes disposing a part of the second end portion of the signal terminal in the groove.

17. The method according to claim 16, wherein
the forming the resin member further includes locating a top surface of the resin member between a bottom of the groove and the bottom surface of the depressed section, the method further comprising
sealing the top surface of the resin member and the groove with another resin member in such a manner that the first heat radiation surface is exposed outside the another resin member.

18. The method according to claim 17, wherein the coupling the semiconductor element further includes:
forming a heat contractive member having a through hole;
inserting the second end portion of the signal terminal into the through hole and attaching the heat contractive member on an outer wall of the second heat sink being opposite a wall of the depressed section that surrounds the bottom surface; and
contracting the heat contractive member by heating so that a clearance between the through hole and the second end portion is filled and the heat contractive member firmly fits the second end portion.

19. The method according to claim 18, wherein
the sealing the top surface of the resin member and the groove with the another resin member includes locating a top surface of the another resin member in a same plane as the first heat radiation surface or between the first heat radiation surface and the bottom surface of the depressed section.

20. The method according to claim 16, wherein the coupling the semiconductor element further includes:
forming a heat contractive member having a through hole;
inserting the second end portion of the signal terminal into the through hole and attaching the heat contractive member on an outer wall of the second heat sink being opposite a wall of the depressed section that surrounds the bottom surface; and
contracting the heat contractive member by heating so that a clearance between the through hole and the second end portion is filled and the heat contractive member firmly fits the second end portion, wherein
the forming the resin member includes sealing the depressed section and the groove with the resin member.

21. The method according to claim 16, wherein
the forming the resin member further includes fully covering the stepped portion of the signal terminal with the resin member.

22. The method according to claim 16, wherein
the forming the resin member further includes putting powdered resin into the depressed section and heating and curing the powdered resin so as to form the resin member.

23. The method according to claim 16, wherein
the forming the resin member further includes forming the resin member by transfer molding, and
the transfer molding includes pouring resin into the depressed section through the groove.

24. The method according to claim 22, wherein
the forming the resin member further includes attaching a buffer tape on the second end surface and the first heat radiation surface.

25. The method according to claim 14, wherein
the coupling the semiconductor element further includes locating the second end surface of the second heat sink in a same plane as the first heat radiation surface or between the first heat radiation surface and the bottom surface of the depressed section.

26. The method according to claim 14, wherein
the coupling the semiconductor element further includes locating the first heat radiation surface in a same plane as the second end surface or between the second end surface and the bottom surface of the depressed section.

27. The method according to claim 14, wherein
the forming the resin member includes locating a top surface of the resin member in a same plane as the first heat radiation surface or between the first heat radiation surface and the bottom surface of the depressed section so that the first heat radiation surface is exposed outside the resin member.

28. The semiconductor device according to claim 1, wherein
the depressed section has a plurality of side surfaces, and
the resin member contacts the bottom surface and the plurality of side surfaces of the depressed section.

29. The method according to claim 14, wherein
the depressed section has a plurality of side surfaces, and
the operation of forming the resin member includes contacting the resin member to the bottom surface and the plurality of side surfaces of the depressed section.

* * * * *